United States Patent
Yuan

(10) Patent No.: US 8,653,849 B2
(45) Date of Patent: Feb. 18, 2014

(54) VOLTAGE MARGIN TESTING DEVICE AND METHOD

(75) Inventor: Lei Yuan, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 263 days.

(21) Appl. No.: 13/083,605

(22) Filed: Apr. 11, 2011

(65) Prior Publication Data

US 2012/0161748 A1    Jun. 28, 2012

(30) Foreign Application Priority Data

Dec. 22, 2010  (CN) .......................... 2010 1 0600610

(51) Int. Cl.
*G01R 31/40*    (2006.01)

(52) U.S. Cl.
USPC ............... 324/764.01; 324/763.01; 324/76.11

(58) Field of Classification Search
USPC ............. 324/750.15, 762.01, 762.02, 762.06, 324/763.01, 764.01
See application file for complete search history.

(56) References Cited

U.S. PATENT DOCUMENTS

| | | | |
|---|---|---|---|
| 5,247,680 A * | 9/1993 | Huber | 702/65 |
| 6,657,499 B2 * | 12/2003 | Lin | 330/296 |
| 7,047,471 B2 * | 5/2006 | Monfared et al. | 714/745 |
| 2002/0063565 A1 * | 5/2002 | Stroth | 324/536 |
| 2007/0151864 A1 * | 7/2007 | Lee et al. | 205/508 |
| 2010/0001699 A1 * | 1/2010 | Dragojevic | 323/234 |
| 2010/0100766 A1 * | 4/2010 | Bengtsson et al. | 714/23 |
| 2011/0128020 A1 * | 6/2011 | Amanuma | 324/750.01 |
| 2012/0081031 A1 * | 4/2012 | Kameyama et al. | 315/291 |

* cited by examiner

*Primary Examiner* — Huy Q Phan
*Assistant Examiner* — Dustin Dickinson
(74) *Attorney, Agent, or Firm* — Altis Law Group, Inc.

(57) ABSTRACT

A voltage margin testing device for testing voltage margin of a unit under test including a voltage terminal includes a button module that selectively allows adjustment of a constant voltage value of a voltage of the voltage terminal, a microcontroller and a digital potentiometer. Selection of the button module causes the microcontroller to adjust a resistance of the digital potentiometer causing the voltage of the voltage terminal to change in increments of the constant voltage value according to the resistance of the digital potentiometer. When the voltage of the voltage terminal is not within the voltage margin, the unit under test works abnormally and sends an error signal to the microcontroller. The microcontroller receives the error signal and adjusts the resistance of the digital potentiometer to change the voltage of the voltage terminal in increments of the constant voltage value until the unit under test works normally.

6 Claims, 2 Drawing Sheets

VOLTAGE MARGIN TESTING DEVICE AND METHOD

BACKGROUND

1. Technical Field

The present disclosure relates to testing devices and testing methods, and particularly to a voltage margin testing device and method for testing a voltage margin of a unit under test.

2. Description of Related Art

An electronic device, such as a computer motherboard, may work normally at a working voltage. The working voltage may vary between an allowable maximum value and an allowable minimum value, that is, the voltage may vary within a certain voltage margin.

To determine an allowable voltage margin, the working voltage may be varied by an adjustment of a rheostat. If the working voltage is out of the voltage margin, the electronic device may give warnings and the rheostat may need to be readjusted. Thus, the testing efficiency and the testing precision are low.

Therefore, it is desired to provide a voltage margin testing device and a voltage margin testing method which can overcome the above-described deficiencies.

BRIEF DESCRIPTION OF THE DRAWINGS

Many aspects of the present voltage margin testing device and method can be better understood with reference to the following drawings. The components in the various drawings are not necessarily drawn to scale, the emphasis instead being placed upon clearly illustrating the principles of the present voltage margin testing device and method.

DETAILED DESCRIPTION

Figure 1:
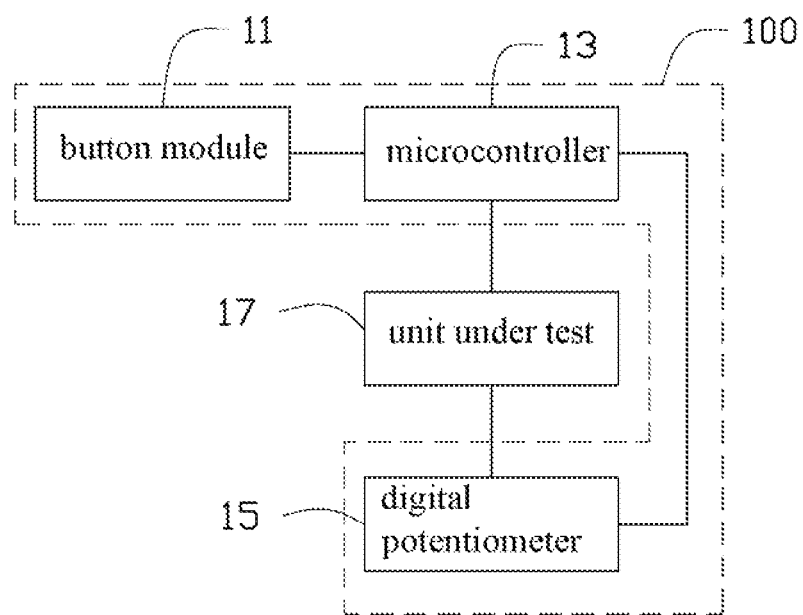
FIG. 1 is a block diagram of a voltage margin testing device and a unit under test according to an exemplary embodiment of the present disclosure.

FIG. 1 shows a voltage margin testing device 100 and a unit under test 17 according to an exemplary embodiment of the present disclosure. The voltage margin testing device 100 includes a button module 11, a microcontroller 13, and a digital potentiometer 15. The button module 11 and the digital potentiometer 15 are electronically connected to the microcontroller 13. The microcontroller 13 and the digital potentiometer 15 are electronically connected to the unit under test 17.

Figure 2:
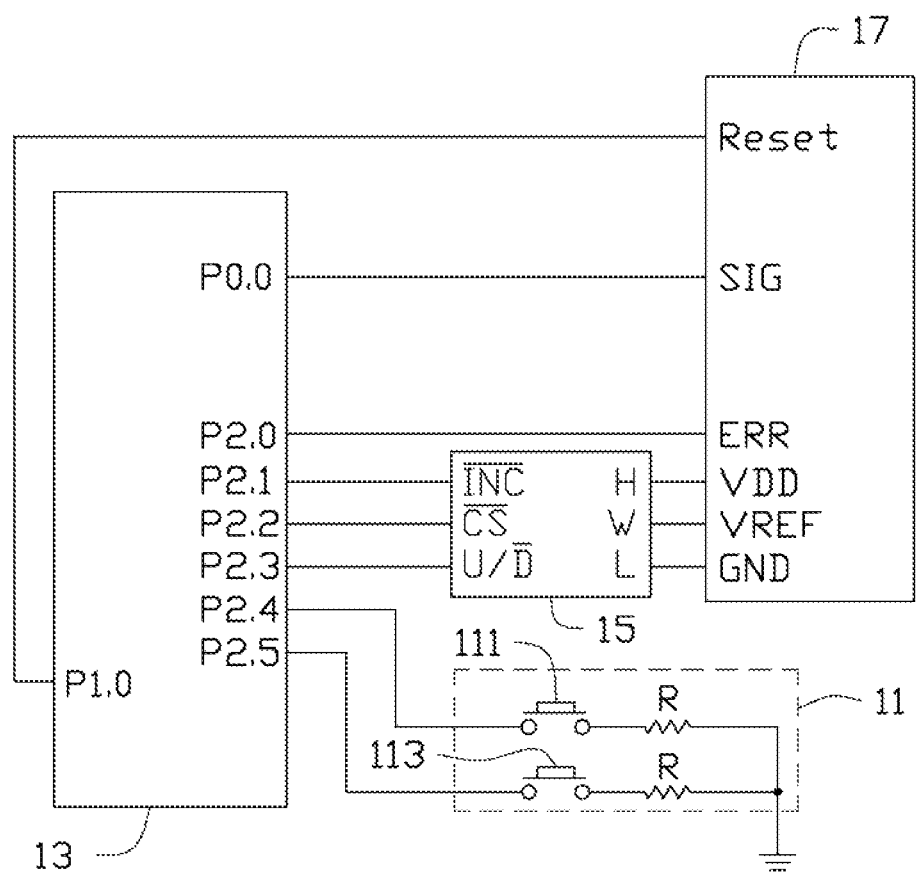
FIG. 2 is a circuit diagram of one embodiment of the voltage margin testing device and the unit under test shown in FIG. 1.

Referring to FIG. 2, the button module 11 includes a first button 111 and a second button 113. Both the first button 111 and the second button 113 are grounded through a current limiting resistor R. In this embodiment, the microcontroller 13 includes a plurality of pins P0.0, P1.0, P2.0~P2.5. The pin P0.0 is electronically connected to a signal terminal SIG of the unit under test 17. The pin P1.0 is electronically connected to a reset terminal Reset of the unit under test 17. The pin P2.0 is electronically connected to an error feedback terminal ERR of the unit under test 17. Each of the pins P2.1~P2.3 is electronically connected to the digital potentiometer 15. The pin P2.4 is electronically connected to the first button 111. The pin P2.5 is electronically connected to the second button 113.

The digital potentiometer 15 includes three control terminals $\overline{INC}$, $\overline{CS}$, $U/\overline{D}$ and three resistor terminals H, W, L. The three control terminals $\overline{INC}$, $\overline{CS}$, $U/\overline{D}$ are operable to receive control signals from the microcontroller 13. In this embodiment, the control terminal $\overline{INC}$ is electronically connected to the pin P2.1, the control terminal $\overline{CS}$ is electronically connected to the pin P2.2, and the control terminal $U/\overline{D}$ is electronically connected to the pin P2.3. The resistor terminal H is electronically connected to a power supply terminal VDD of the unit under test 17. The resistor terminal W is electronically connected to a reference voltage terminal VREF of the unit under test 17. The resistor terminal L is electronically connected to a ground terminal GND of the unit under test 17. The digital potentiometer 15, in one example, can be a rheostat that is digitally controlled, the resistor terminal W can be referred to as a wiper terminal of the rheostat, and the resistor terminals H, L can be referred to as two ends of the rheostat. The operation modes of the digital potentiometer 15 are shown in the following table, and "X" in the table is capable of representing any value.

| $\overline{INC}$ | $\overline{CS}$ | $U/\overline{D}$ | Operation |
|---|---|---|---|
| high to low | low | high | wiper terminal toward H |
| high to low | low | low | wiper terminal toward L |
| high | low to high | X | store wiper terminal position |

The working process of the voltage margin testing device 100 may be as follows: when the voltage margin testing device 100 is powered on, the voltage of the pins P2.1, P2.4, P2.5 are at a high logic level (i.e., digital 1), the voltage of the pin P2.2 is at a low logic level (i.e., digital 0).

The voltage of the pin P2.4 changes from logic high to logic low about when the first button 111 is pressed. When the unit under test 17 works normally, the unit under test 17 sends a status signal to the microcontroller 13 through the signal terminal SIG. When the microcontroller 13 receives the status signal, the voltage of the pin P2.1 changes from logic high to logic low, and the voltage of the pin P2.3 is at a high logic level. Correspondingly, the voltage of the control terminal $\overline{INC}$ changes from logic high to logic low, and the voltage of the control terminal $U/\overline{D}$ is at a high logic level. Referring to the above-mentioned table, the resistance between the resistor terminal W and the resistor terminal L is increased. The voltage of the reference voltage terminal VREF is directly proportional to the resistance between the resistor terminal W and the resistor terminal L, and then the voltage of the reference voltage terminal VREF increases. Each time the first button 111 is pressed, the voltage of the reference voltage terminal VREF increases a constant voltage value $\Delta V$, such as 5 millivolts.

When the voltage of the reference voltage terminal VREF is greater than an allowable maximum reference voltage value of the unit under test 17 (that is, the voltage of the reference voltage terminal VREF increases to be out of a voltage margin of the unit under test 17), the unit under test 17 sends a first error signal to the microcontroller 13 through the error feedback terminal ERR. When the microcontroller 13 receives the first error signal, the voltage of the pin P2.1 changes from logic high to logic low, and the voltage of the pin P2.3 is at a low logic level. Referring to the above-mentioned table, the resistance between the resistor terminal W and the resistor terminal L is decreased, and then the voltage of the reference voltage terminal VREF decreases. When the voltage of the reference voltage terminal VREF decreases the constant voltage value $\Delta V$, the voltage of the pin P2.1 is at a high logic level, and the voltage of the pin P2.2 changes from logic low to logic high. Referring to the above-mentioned table, the resistance between the resistor terminal W and the resistor terminal L is unchanged.

The microcontroller 13 sends a reset signal to the unit under test 17 through the pin P1.0. According to the reset signal, the unit under test 17 restarts. If the unit under test 17 works normally after the restart, the voltage of the reference voltage terminal VREF is the allowable maximum reference voltage value of the unit under test 17. If the unit under test 17 works abnormally after the restart, the unit under test 17 sends the first error signal to the microcontroller 13 through the error feedback terminal ERR. The voltage of the reference voltage terminal VREF decreases the constant voltage value ΔV again, and the unit under test 17 restarts again.

The voltage of the pin P2.5 changes from logic high to logic low about when the second button 113 is pressed. When the unit under test 17 works normally, the unit under test 17 sends a status signal to the microcontroller 13 through the signal terminal SIG. When the microcontroller 13 receives the status signal, the voltage of the pin P2.1 changes from logic high to logic low, and the voltage of the pin P2.3 is at a low logic level. Correspondingly, the voltage of the control terminal $\overline{INC}$ changes from logic high to logic low, and the voltage of the control terminal U/$\overline{D}$ is at a low logic level. Referring to the above-mentioned table, the resistance between the resistor terminal W and the resistor terminal L is decreased. The voltage of the reference voltage terminal VREF decreases. Each time the second button 113 is pressed, the voltage of the reference voltage terminal VREF decreases the constant voltage value ΔV.

When the voltage of the reference voltage terminal VREF is smaller than an allowable minimum reference voltage value of the unit under test 17 (that is, the voltage of the reference voltage terminal VREF decreases to be out of the voltage margin of the unit under test 17), the unit under test 17 sends a second error signal to the microcontroller 13 through the error feedback terminal ERR. When the microcontroller 13 receives the second error signal, the voltage of the pin P2.1 changes from logic high to logic low, and the voltage of the pin P2.3 is at a high logic level. Referring to the above-mentioned table, the resistance between the resistor terminal W and the resistor terminal L is increased, and then the voltage of the reference voltage terminal VREF increases. When the voltage of the reference voltage terminal VREF increases the constant voltage value ΔV, the voltage of the pin P2.1 is at a high logic level, and the voltage of the pin P2.2 changes from logic low to logic high. Referring to the above-mentioned table, the resistance between the resistor terminal W and the resistor terminal L is unchanged.

The microcontroller 13 sends the reset signal to the unit under test 17 through the pin P1.0. According to the reset signal, the unit under test 17 restarts. If the unit under test 17 works normally after the restart, the voltage of the reference voltage terminal VREF is the allowable minimum reference voltage value of the unit under test 17. If the unit under test 17 works abnormally after the restart, the unit under test 17 sends the second error signal to the microcontroller 13 through the error feedback terminal ERR. The voltage of the reference voltage terminal VREF increases the constant voltage value ΔV again, and the unit under test 17 restarts again.

As detailed above, selection of the button module 11 causes the microcontroller 13 to adjust a resistance of the digital potentiometer 15 causing the voltage of the reference voltage terminal VREF to change in increments of the constant voltage value according to the resistance of the digital potentiometer 15. When the voltage of the reference voltage terminal VREF is not within the voltage margin, the unit under test 17 works abnormally, then the resistance of the digital potentiometer 15 is adjusted to change the voltage of the voltage terminal in increments of the constant voltage value until the unit under test 17 works normally. The voltage margin testing device 100 allows for easy operation, high testing efficiency, and high testing precision in testing voltage margin of the unit under test 17.

In an alternative exemplary embodiment, the microcontroller 13 is electronically connected to a display unit for displaying the allowable maximum voltage value and the allowable minimum voltage value of the unit under test 17.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A voltage margin testing device for testing voltage margin of a unit under test including a voltage terminal, the voltage margin testing device comprising:
   a button module that selectively allows adjustment of a constant voltage value of a voltage of the voltage terminal, the button module comprising a first button and a second button, each of the first button and the second button grounded through a current limiting resistor;
   a microcontroller electronically connected to the button module; and
   a digital potentiometer electronically connected to the microcontroller and the unit under test;
   wherein selection of the button module causes the microcontroller to adjust a resistance of the digital potentiometer causing the voltage of the voltage terminal to change in increments of the constant voltage value according to the resistance of the digital potentiometer; each time the first button is pressed, the voltage of the voltage terminal increases the constant voltage value, each time the second button is pressed, the voltage of the voltage terminal decreases the constant voltage value; and wherein when the voltage of the voltage terminal is not within the voltage margin, the unit under test works abnormally and sends an error signal to the microcontroller, the microcontroller receives the error signal and adjusts the resistance of the digital potentiometer to change the voltage of the voltage terminal in increments of the constant voltage value until the unit under test works normally, after the microcontroller receives the error signal and adjusts the resistance of the digital potentiometer causing a variation of the constant voltage value in the voltage of the voltage terminal, the unit under test restarts under the control of the microcontroller; when the first button is pressed, and the unit under test works normally after the restart, the voltage of the voltage terminal is an allowable maximum voltage value of the unit under test.

2. The voltage margin testing device as claimed in claim 1, wherein the digital potentiometer comprises a plurality of control terminals electronically connected to the microcontroller, and a plurality of resistor terminals electronically connected to the unit under test.

3. The voltage margin testing device as claimed in claim 1, wherein when the second button is pressed, and the unit under test works normally after the restart, the voltage of the voltage terminal is the allowable minimum voltage value of the unit under test.

4. A voltage margin testing method for testing voltage margin of a unit under test including a voltage terminal, comprising:

provided a voltage margin testing device including a button module, a microcontroller electronically connected to the button module, and a digital potentiometer under the control of the microcontroller, the button module comprising a first button and a second button, each of the first button and the second button grounded through a current limiting resistor;

selectively allowing adjustment of a constant voltage value of a voltage of the voltage terminal through the button module;

adjusting a resistance of the digital potentiometer according selection of the button module, each time the first button is pressed, the voltage of the voltage terminal increases the constant voltage value, each time the second button is pressed, the voltage of the voltage terminal decreases the constant voltage value; and the voltage of the voltage terminal changes in increments of the constant voltage value according to the resistance of the digital potentiometer;

when the voltage of the voltage terminal is not within the voltage margin and the unit under test works abnormally, adjusting the resistance of the digital potentiometer to change the voltage of the voltage terminal in increments of the constant voltage value until the unit under test works normally, restarting the unit under test;

when the first button is pressed, and the unit under test works normally after the restart, the voltage of the voltage terminal is an allowable maximum voltage value of the unit under test.

5. The voltage margin testing method as claimed in claim 4, wherein the digital potentiometer comprises a plurality of control terminals electronically connected to the microcontroller, and a plurality of resistor terminals electronically connected to the unit under test.

6. The voltage margin testing method as claimed in claim 4, wherein when the second button is pressed, and the unit under test works normally after the restart, the voltage of the voltage terminal is the allowable minimum voltage value of the unit under test.

* * * * *